(12) United States Patent
Mills et al.

(10) Patent No.: US 9,097,588 B2
(45) Date of Patent: Aug. 4, 2015

(54) DOSE RESPONSIVE UV INDICATOR

(75) Inventors: Andrew Mills, Belfast (GB); Michael McFarlane, Glasgow (GB); Kate McDiarmid, Glasgow (GB); Pauline Grosshans, Glasgow (GB)

(73) Assignee: Intellego Technologies AB, Gothenburg (SE)

( * ) Notice: Subject to any disclaimer, the term of this patent is extended or adjusted under 35 U.S.C. 154(b) by 393 days.

(21) Appl. No.: 13/140,617

(22) PCT Filed: Dec. 18, 2009

(86) PCT No.: PCT/GB2009/002908
§ 371 (c)(1),
(2), (4) Date: Feb. 6, 2012

(87) PCT Pub. No.: WO2010/070290
PCT Pub. Date: Jun. 24, 2010

(65) Prior Publication Data
US 2012/0137958 A1      Jun. 7, 2012

(30) Foreign Application Priority Data

Dec. 20, 2008   (GB) .................................. 0823282.9

(51) Int. Cl.
*G01N 5/00*      (2006.01)
*G01N 21/00*     (2006.01)
*G01J 1/50*      (2006.01)
(Continued)

(52) U.S. Cl.
CPC . *G01J 1/50* (2013.01); *C09D 11/00* (2013.01); *G03F 7/004* (2013.01); *G03F 7/2002* (2013.01); *G03F 7/70558* (2013.01)

(58) Field of Classification Search
CPC .... G03F 7/004; G03F 7/2002; G03F 7/70558
USPC ................................ 250/474.1, 482.1, 484.5
See application file for complete search history.

(56) References Cited

U.S. PATENT DOCUMENTS 3,112,200 A    11/1963   Wainer
4,829,187 A     5/1989   Tomita et al.
(Continued)

FOREIGN PATENT DOCUMENTS

EP      0 325 863 A2    8/1989
EP      1 235 060 A1    8/2002
(Continued)

OTHER PUBLICATIONS

Search Report for Great Britain Application No. 0823282.9, dated Aug. 4, 2009.
(Continued)

*Primary Examiner* — David Porta
*Assistant Examiner* — Jeremy S Valentiner
(74) *Attorney, Agent, or Firm* — Alston & Bird LLP

(57) ABSTRACT

A UV radiation (UVR) response indicator comprises a first UVB and/or UVA radiation sensitive material which has been modified so as to display an altered characteristic in a delayed manner in response to UVB and/or UVA radiation exposure. The UV indicator is capable of displaying exposure to increased UV radiation over a period of time. The present invention also relates to a method of displaying a relative amount of exposure to UVR by a UV indicator over a period of time. The invention is particularly useful in detecting the level of exposure to sunlight or sunbed radiation.

40 Claims, 5 Drawing Sheets 0 minutes(0.00 MED)    15 minutes(0.45 MED)    33 minutes(1.00 MED)

48 minutes(1.45 MED)   66 minutes(2.00 MED)   81 minutes(2.45 MED)

(51) Int. Cl.
*G03F 7/004* (2006.01)
*G03F 7/20* (2006.01)
*C09D 11/00* (2014.01)

(56) References Cited

U.S. PATENT DOCUMENTS

| | | | |
|---|---|---|---|
| 5,028,792 A | 7/1991 | Mullis | |
| 5,117,116 A | 5/1992 | Bannard et al. | |
| 5,411,835 A | 5/1995 | Brinser | |
| 5,436,115 A * | 7/1995 | Mullis | 430/338 |
| 5,441,850 A * | 8/1995 | Marshall et al. | 430/336 |
| 5,919,601 A * | 7/1999 | Nguyen et al. | 430/278.1 |
| 6,060,321 A | 5/2000 | Hovorka | |
| 6,242,154 B1 * | 6/2001 | Grasshoff et al. | 430/270.1 |
| 6,504,161 B1 * | 1/2003 | Jackson et al. | 250/474.1 |
| 2001/0019110 A1 | 9/2001 | Faran et al. | |
| 2001/0036591 A1 * | 11/2001 | Schulz et al. | 430/270.1 |
| 2002/0000298 A1 | 1/2002 | Donohoe | |
| 2003/0139484 A1 * | 7/2003 | Bentsen et al. | 522/2 |
| 2006/0289796 A1 | 12/2006 | Havens et al. | |
| 2008/0185534 A1 * | 8/2008 | Simon et al. | 250/473.1 |
| 2009/0197987 A1 * | 8/2009 | Hayoz et al. | 522/17 |
| 2009/0224176 A1 * | 9/2009 | Patel | 250/474.1 |
| 2011/0293908 A1 * | 12/2011 | Jeganathan et al. | 428/211.1 |

FOREIGN PATENT DOCUMENTS

| | | |
|---|---|---|
| GB | 2 239 150 A | 6/1991 |
| WO | WO 9401503 A1 * | 1/1994 |
| WO | WO 99/14573 A1 | 3/1999 |
| WO | WO 01/42747 A2 | 6/2001 |
| WO | WO 2008/144541 A1 | 11/2008 |

OTHER PUBLICATIONS

International Search Report and Written Opinion from International Application No. PCT/GB2009/002908 dated Mar. 25, 2010.
Abdel-Fattah A A et al.; "Thymol-Blue Dyed Poly(vinyl butyral) Films for Monitoring Ultraviolet Radiation"; *Journal of Photochemistry and Photobiology*; vol. 137, No. 1; Oct. 24, 2000; pp. 37-43; XP007912245.

* cited by examiner (a)　　　　　　　　(b)

DOSE RESPONSIVE UV INDICATOR

CROSS REFERENCE TO RELATED APPLICATIONS

This application is a national stage application filed under 35 U.S.C. 371 of International Application No. PCT/GB2009/002908, filed Dec. 18, 2009, which claims priority from Great Britain Application No. 0823282.9, filed Dec. 20, 2008.

FIELD OF THE INVENTION

The present invention relates to UV indicator devices which are capable of displaying exposure to increased UV radiation over a period of time, as well as a method of displaying a relative amount of exposure to UV over a period of time.

BACKGROUND OF THE INVENTION

Overexposure to ultraviolet radiation (UVR) is a recognised health hazard. Acute effects arising from short-term exposure include sunburn (erythema) and photo-conjunctivitis. Long-term exposure can lead to chronic conditions such as photoaging, skin cancer and cataracts. Incident UVR levels are usually measured based on the UV index system, where a UVI value of 6 is typical of summer's day in the UK and equivalent to an effective UV irradiance of 150 mW m$^{-2}$. The minimum erythemal dose, MED, is the minimum amount of UVR likely to cause erthema and is (i.e. MED=1) ca. 250 J m$^{-2}$ for most Caucasians, i.e. skin type II. Thus, the latter would be likely to sunburn after only 28 min on a summer's day in the UK. Despite the much greater awareness of the general public of the potential dangers of UVR overexposure, the number of attributed cases of skin cancer continues to rise such are the continued attractions of possessing a suntan. In the UK currently ca. 50,000 people develop skin cancer pa, 8000 of which are malignant leading to ca. 2000 deaths pa.

The major problem with sunburn is that the usual signs of skin burning and damage are delayed; often taking 4-8 h to appear. Thus, it is would be useful to have an easily read real-time indicator which shows when an MED=1 value has been reached for any particular skin type and it is time to cover up from the sun. There are several notable UV dosimeters on the market, including: SolarSafe, SunSignals and SunCheck. Most utilise a single gradual colour change which makes it hard to identify useful stages in the development of sunburn, such as MED=0.5 and 1.

One method to detect irreversibly UV light is to combine UV-driven acid release agents, HA, including chloral hydrate (CH) and iodonium and sulphonium salts with the deprotonated form of a pH indicator (D$^-$). The two key processes can be summarised as follows:

  (1)

  (2)

The result is that with UV irradiation time the deprotonated form of the dye, D, is converted into its conjugate acid form, DH and this is associated with a colour change since, given the nature of pH indicators, D$^-$ is very differently coloured to DH. For example, Thymol Blue (TB$^-$) is yellow whereas TBH is red. However, such a system is generally understood to result in a prompt or substantially instantaneous colour change in response to UV stimulation, which does not therefore easily allow a user to determine a relative UV dose, or a UV dose over time.

Papers published by Abdel-Fattah et al deal primarily with such UV dosimeters based on the chloral hydrate acid release agent, supported on a glass substrate[1,2].

U.S. Pat. No. 4,829,187 covers a UV dosimeter which uses a UV driven acid release agent in an indicator layer supported on a polymer or paper substrate, with a UV blocking layer on top. Alkyl halides may be used as the HA in this system.

U.S. Pat. No. 5,117,116 describes a plastic (PVC) device, attached to the skin with a pressure sensitive adhesive, which supports an indicator label just above the surface of the skin. The preferred photosensitive material in this device is an oxazolidine-dione compound but it is noted that other materials can be used, such as a combination of iodonium salts and pH sensitive dyes.

U.S. Pat. No. 6,504,161 describes "Sun Signals"™ device distributed by Sun Health Solutions and is similar in design to the system described in U.S. Pat. No. 5,117,116. This device relies on the change in colour of a pH sensitive dye—including any from the Aldrich Handbook of Stains, Dyes and Indicators—caused by the release of acid from an alkyl halide. The dye and halide are contained in a polymer support. The single colour change in this system is designed to disguise or reveal a graphic pattern depending on the manufacturer's preference.

Finally, US 2002/00298 describes a polymer layer applied directly to the skin which contains a UV sensitive agent. This agent is primarily taken from classic photochromic groups—spirooxazines, spiropyrans, fulgides, fulgimides, bisimadizoles, viologen derivatives and combinations thereof—but it is mentioned that a system incorporating iodonium salts, i.e. a UV driven acid release agent, may be used.

Nevertheless, all of the above devices describe single colour change, prompt, UV indicators/dosimeters; the only guide to the UV dose received being the depth of the colour change. Moreover, they all disclose devices which provide little information with regards to the level of the UV dose received nor a very clear indication when a MED=1 level has been achieved.

It is amongst the objects of the present invention to obviate and/or mitigate at least one of the aforementioned disadvantages.

It is an object of the present invention to provide a device/method which utilises a delayed UV indicator, which can optionally be used in conjunction with a prompt UV indicator to highlight key, different UV doses, such as 0.5, 1, and 2 MED.

SUMMARY OF THE INVENTION

The present invention is based on providing a UV indicator or method of detecting exposure to UV which is based on an indicator which displays a delayed response to UV exposure, and which can optionally be used with one that exhibits a prompt response.

In a first aspect there is provided a UV radiation (UVR) response indicator which comprises a UVR sensitive material which has been modified so as to display an altered characteristic in a delayed manner in response to UVR exposure.

The UVR sensitive material may be modified so as to display its altered characteristic in response to different MED values, such as 0.5, 1.0, 1.5, 2.0, 2.5 etc. In this manner display of the altered characteristic is delayed until a specified or chosen dose, such as a particular MED value, has been received by the UVR sensitive material.

Optionally, the delayed response UVR sensitive material may be used in conjunction with a "prompt" response UVR sensitive material.

Thus, in a further aspect there is provided a UV radiation responsive indicator device for use in indicating exposure to UV radiation over a period of time, the UV indicator comprising;

a) a first UVR sensitive material which has been modified so as to display an altered characteristic in a delayed manner on exposure to UVR radiation; and b) a second UVR sensitive material which is capable of displaying an altered characteristic promptly on exposure to UVR.

Both prompt and delayed UVR sensitive materials may have their response characteristics altered/tempered through the use of a UV filtering agent.

Preferably, the first and second UVR sensitive material displays an altered characteristic upon UV radiation exposure, which is substantially irreversible.

Typically, desirably said altered characteristics of the first and second UV sensitive materials are discernable from one another. Preferably, the altered characteristic is a change in colour.

Preferably, the first and second UVR sensitive material comprises UV-driven acid release agents which display altered colour between the deprotonated and acid forms. Typical UV-driven acid release agents include dyes such as chloral hydrate (CH) and iodonium and sulphonium salts such as: diphenyl iodonium chloride (DPIC), DPI-hexafluorophosphate, DPI-perfluor-1-butanesulfonate, DPI-triflate, 4-iodophenyl-diphenyl sulfonium triflate (IDST), 4-methylthiophenyl-DST, 2-napthyl-DST, 4-chlorophenyl-DST, and 4-bromophenyl-DST, with the deprotonated form of a pH indicator ($D^-$), such as thymol blue ($TB^-$), Malachite Green (MG), Bromocresol Green (BG), Indophenol Blue (IB), Waxoline Blue (WB), hydroxyethyl amino-azobenzene, methyl red (MR), phenol red (PhR) and any other di/triphenyl methane, aminoazo, aminoanthraquinone dye, or other pH sensitive dye.

The first UVR sensitive material is delayed in its response to UV radiation, by addition of a proton-scavenging agent, i.e. a base, to delay protonation of the indicating dye by the UV-driven acid release agents. Conveniently, proton scavenging agents such as $NaOH$, $Na_2CO_3$, $NaHCO_3$, $NH_4OH$, $Ca(OH)_2$ or any other common base, may be used.

Thus, in a further aspect there is provided a UVR responsive indicator device for use in indicating exposure to UVR over a period of time, the indicator device comprising:

a) a first UVR sensitive material which has been modified so as to display an altered characteristic, in a delayed manner on exposure to UVR, wherein the first UVR sensitive material is modified by way of a base that reacts with protons generated by acid release agent, on exposure to UVR; and b) optionally a second UVR sensitive material which is capable of displaying an altered characteristic promptly on exposure to UVR;

Conveniently, the first ("delayed") and optional second ("prompt") UVR sensitive material is provided in the form of ink which may be coated onto a substrate or the like. Such ink may be coated one on top of the other, e.g. the first UV sensitive material on top of the second UV sensitive material, or vice versa. Alternatively, the first UV sensitive material may be coated/printed on one side of a UV transparent substrate and the second UV sensitive material on the other side.

In use, the altered characteristics of said first and second UV sensitive materials may combine to provide a visual indication of a degree of UV dose, typically over time. For example, the second prompt UVR sensitive material may change characteristic, such as change colour in response to a first initial dose/level of UVR and the first delayed UVR sensitive material may change characteristic, such as colour in response to an increased dose of UV. For example, the second UVR sensitive material may be provided to change colour from colourless to green on exposure to a first dose of UVR and the first UVR sensitive material may be provided to change colour from yellow to red/pink on exposure to a second increased dose of UVR. Such changes in colour can be visualised separately by way of discrete areas of said first and second UV sensitive material. Alternatively, when printed on top of one another, the colour changes may be varied progressively in a "traffic" light manner.

The substrate may also be coloured so as to match/correspond to an initial colour or altered colour of the ink and in this way the ink can be printed in a particular manner so as to reveal or obscure an image in response to UVR. For example, an indicator could be provided so as to reveal a word such as "care" in response to the first dose and reveal the word "extreme" in response to the second increased dose, so as to then convey to a user that "extreme care" should be exercised. Many other patterns, symbols or text can be envisaged, such as a stylised happy face on exposure to the first dose, followed by a cross appearing over the stylised happy face in response to the second dose.

It is mostly the UVB component of solar UV that is responsible for solar-induced biological damage, such as sunburn. Therefore a UV sensitive material that is more effective at absorbing UVB light than UVA light can provide a sensor that measures the dose of the damaging UVB light. Accordingly a UV sensitive material that selectively absorbs UVB light (280-315 nm equivalent to a band gap of 4.4 to 3.9 eV) is preferred, for example in applications where biological damage is measured. For other applications a UV sensitive material that absorbs UV light over another selected range may be employed. In some applications a mixture of two or more UV sensitive materials may be used in a composition of the invention, for example to broaden the range of sensitivity to UV light.

UVR responsive indicators of the present invention may be used as a disposable device formed to be worn by an individual as a UV dosimeter to show when too much exposure to sunlight occurs. For example the device may take the form of a plastic wristband that includes an area coated with or impregnated with the first delayed and optionally prompt second UVR sensitive material. The indicator may be used in label form with the composition printed on the label as an ink, for example. The sensor may be in the form of a transfer applied to the skin or a composition in the form of an ink may be used to mark directly on to skin. In use, such sensors can be coated with sunscreen to provide a measure of the UV dose absorbed through the sunscreen if desired.

Using a composition sensitive to both UVA and UVB (200-400 nm) and another only sensitive to UVB can also be useful. The UVB sensitive composition will warn of overexposure to the more damaging UVB light whilst the UVA and UVB sensitive composition gives a measure of overall exposure to UV (dose of tanning radiation).

Indicators may include control areas displaying said first, second or combined altered characteristics, such as permanently coloured areas, whose colour characteristics correspond to that of the UV sensitive material when a particular amount of UV has been absorbed. Visual comparison between the material and a control area(s) over time allows estimation of the UV light absorbed.

The above methods are particularly useful, for example where a personal dosimeter to determine exposure of an individual to sunlight is desired. Alternative means of assessing the amount of UV absorption may be employed, especially in other applications. For example an altered colour of the UV sensitive material may be measured using a spectrophotometer. This approach can be useful when an automated measurement of UV dose is desired. For example, for a large number of sensors or where particularly accurate results are required. Sensors of the invention may be used in tags attached to large numbers of items being subject to a UV sterilisation procedure. The sensors provide a measure of the UV exposure that can be rapidly confirmed by the results from the spectrophotometer and collated automatically for analysis in a computer.

Typically, the indicators of the invention are stable for many months provided they are protected from UV light. Indicators of the invention may therefore be provided with a removable UV impermeable barrier. For example a sheet of UV impermeable plastics material such as polymer containing a polyoxyalkylene, provided with a layer of a peel-able pressure sensitive adhesive that is attached to the indicator to cover and protect the UV sensitive material from UV light until it is removed at the point of use.

In a further aspect, the present invention provides a method of detecting a dose of UVR received by a UV indicator, the method comprising the steps of providing a UV dosimeter which comprises a UVR sensitive material which has been modified so as to display an altered characteristic in a delayed manner on exposure to UVR; exposing said UV dosimeter to UVR displayed; and detecting said UVR by virtue of the altered characteristic of said UVR sensitive material being displayed.

The method may further comprise comparing any displayed altered characteristics upon exposure to UVR with reference characteristics corresponding to known UV doses, so as to aid in detection/determination of the relative UV dose received by the indicator.

BRIEF DESCRIPTION OF DRAWINGS

The present invention will now be further described by way of example and with reference to the figures which show.

DETAILED DESCRIPTION OF EMBODIMENTS

Preparation

A delayed UV dosimeter was made using a thymol blue stock solution, 40 mg of TB and 0.75 ml of 0.1M NaOH added to a 25 ml volumetric flask and made up to the mark. A typical polymer solution used was 5% w/v PVB in 1-butanol—the polymer encapsulates the UV dosimeter ingredients after solvent evaporation. A final stable ink form of the delayed UV dosimeter comprised 0.0032 g of diphenyliodonium chloride (DPIC), 0.5 ml of the thymol blue stock solution and 4 ml of the 5% PVB solution. This ink was then stirred for at least 3 hours to ensure even mixing and after this time the ink was orange-yellow in colour and ready for use.

A prompt malachite green UV dosimeter was prepared by dissolving 20 mg of malachite green carbinol base, 100 mg of chloral hydrate in 4 g of 5% w/v/PVB in 1-butanol solution, adding 0.05 ml of 0.1M NaOH solution in water and stirring for at least 3 hours, giving a very pale (almost colourless) green coloured ink.

The ink was usually deposited on polypropylene (PP) (75 μm thick, Goodfellow, England) using a size 8 k-bar. The sheet of PP was placed and secured on a clipboard and the k-bar was placed lying at the top of the sheet. A thin line of the ink solution was poured onto the sheet just further down the sheet than the k-bar, the bar was placed so that it was in contact with the ink and was then slowly and evenly drawn down the sheet to give a consistent film. This sheet was then placed in the dark for at least 3 hours to dry. The process was repeated 4 times to produce thick films.

Irradiation

Irradiations were carried out with either a solar simulator UV lamp, designed to simulate the spectrum of terrestrial UV light received from the sun, hence it produces a large amount of UVA light, a small amount of UVB and negligible amounts of UVC light. This is achieved by employing a xenon arc lamp with UG5 and WG20 filters in line, following the method previously described by Diffey [B. L. Diffey, Methods, 28 (2002) 4-13.]. The UVI of this lamp was measured with a SafeSun™ solar meter and the current to the lamp and the distance of the sample from the lamp were altered so that the sample was irradiated at UVI 5.

Results

Figure 1:
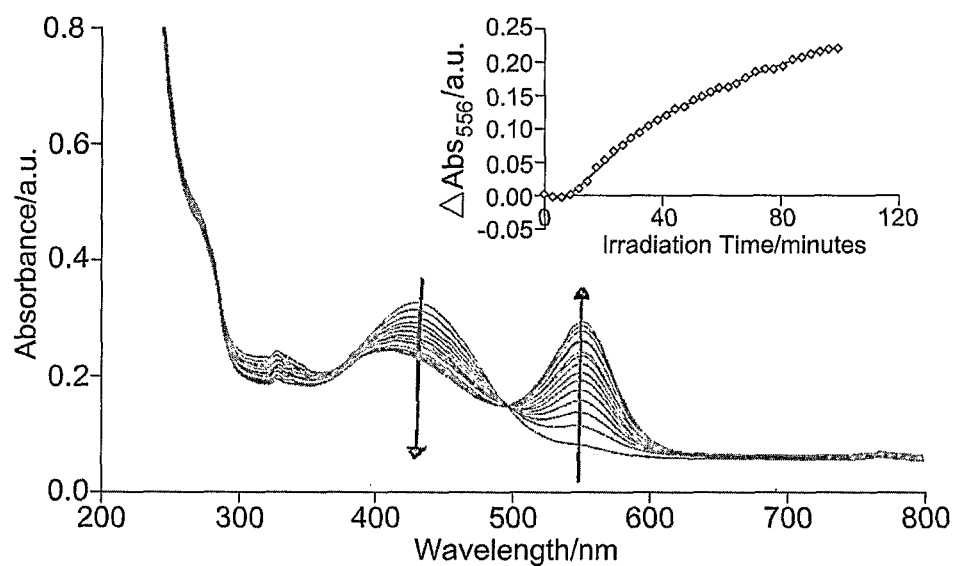
FIG. 1 shows the change in the absorption spectrum of a delayed 3 layer thick film thymol blue, DPIC and 0.05 phr NaOH UV dosimeter in PVB on polypropylene (PP) irradiated with UVI 5 solar simulated UV light. The spectra were recorded every 3 minutes and show an increase in the right hand absorption band at 556 nm as well as a decrease in the band ca. 430 nm. The insert shows the plot of $\Delta Abs_{556}$ against irradiation time.

The typical spectral changes observed for a delayed (response) TB/DPIC/NaOH/PVB on PP UV dosimeter are shown in FIG. 1.

Figure 2:
FIG. 2 shows photographs of the film in FIG. 1, before (a) and after (b) UV irradiation. (a) shows the initial yellow film while (b) shows the same film which has developed a pink coloured spot in the centre.
Figure 2:
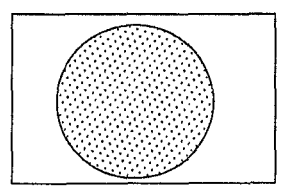

FIG. 2 illustrates typical photographs of the indicator before (a) and after (b) (99 min) irradiation with the UV solar simulator (UVI 5); the latter is equivalent to 3 MED.

Figure 3:
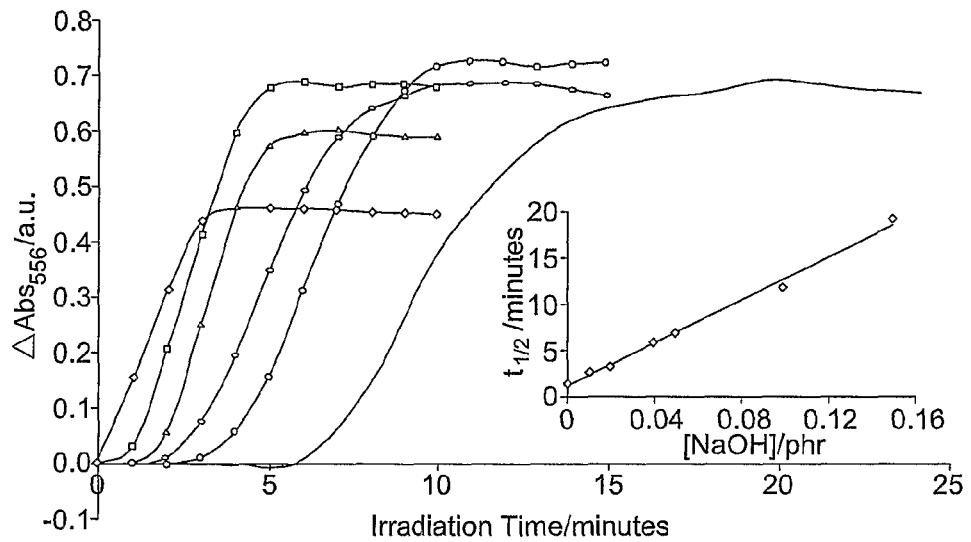
FIG. 3 shows a plot of $\Delta Abs_{556}$ against irradiation time for thick, delayed thymol blue and chloral hydrate in PVB UV dosimeters with NaOH concentrations, from left to right on the graph, of 0.00, 0.01, 0.02, 0.04, 0.05 and 0.10 phr when irradiated with 4 mW cm$^{-2}$ UVB light. Insert shows the plot of $t_{1/2}$ (time taken for half the full colour to develop upon UV irradiation) against NaOH concentration in phr.

The key feature of a delayed UV indicator system is the use of a base to delay the response of a typical pH indicator acid releasing agent UV dosimeter. In the thymol blue indicator described above, the response of the UV dosimeter is reflected by the variation of the absorbance of the film at 556 nm, $\Delta Abs_{556}$, due to the red/pink colour of the film. The observed variation of $Abs_{556}$ as a function of time is illustrated in FIG. 3 for a TB/CH/NaOH/PVB on glass. The time taken for the absorbance to reach half its maximum value is proportional to the concentration of delaying agent, i.e. base, added; in this case the base was NaOH.

Figure 4:
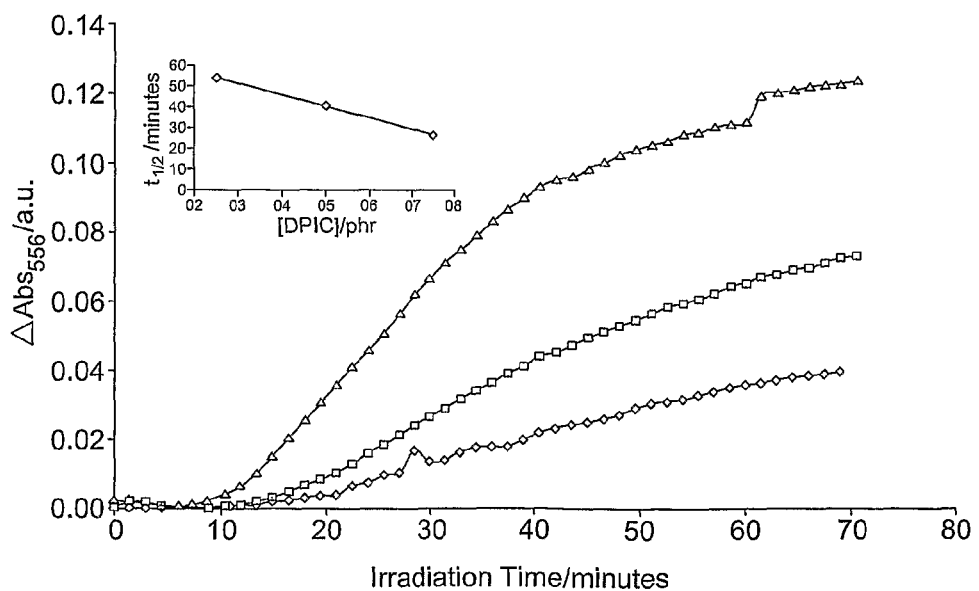
FIG. 4 shows a plot of $\Delta Abs_{556}$ against irradiation time for thick, delayed thymol blue and DPIC in PVB dosimeters with DPIC concentrations, from left to right on the graph, of 0.25, 0.5 and 0.75 phr when irradiated with UVI 10 solar simulated light. Insert shows the plot of $t_{1/2}$ (time taken for half the colour to develop) against DPIC concentration in phr.

In cases were the base concentration must be as high as possible, when the ink is coated onto acidic papers for example, the concentration of the acid release agent can be altered to change the length of delay. The observed variation of $Abs_{556}$ as a function of time is illustrated in FIG. 4 for a TB/DPIC/NaOH/PVB film. The time taken for the absorbance to reach half its value is proportional to the concentration of the acid release agent; in this case the acid release agent is DPIC.

Figure 5:
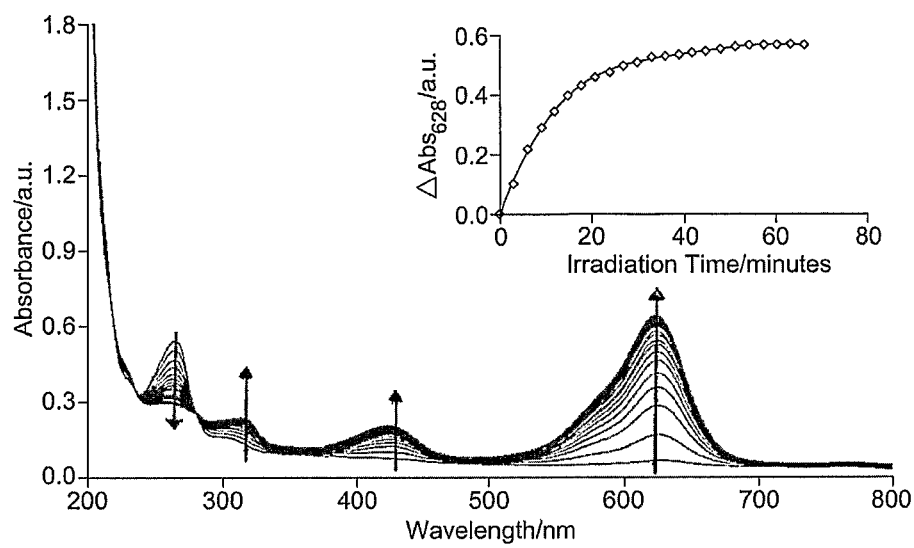
FIG. 5 shows the change in the absorption spectrum of a thin film malachite green, chloral hydrate and 0.08 phr NaOH in PVB prompt UV dosimeter on PP when irradiated with UVI 5 solar simulated UV light. The spectra were recorded every 3 minutes and show an increase in the absorbance band at 628 nm as well as increases at ca. 420 and 310 nm, with a decrease in the band ca. 270 nm. Insert shows the plot of $\Delta Abs_{628}$ against irradiation time.
Figure 6:
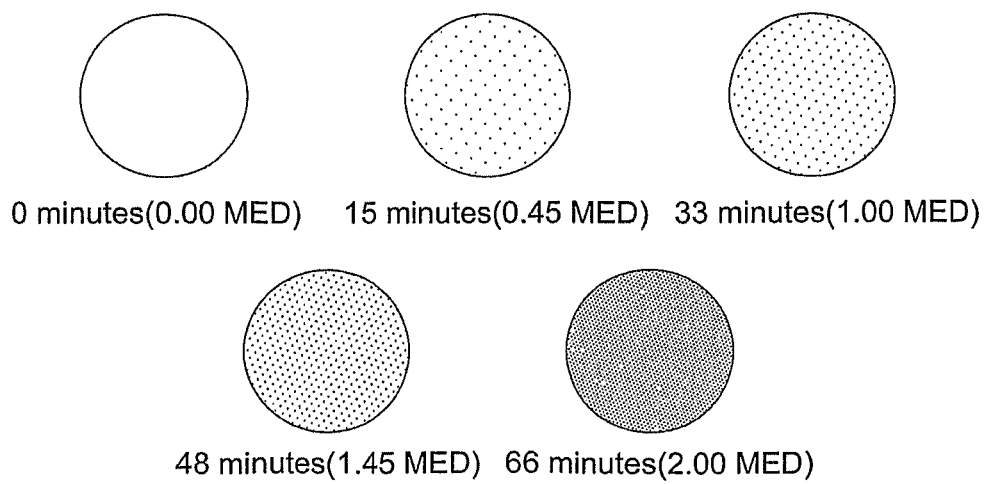
FIG. 6 shows photographs of a thin film malachite green, chloral hydrate and 0.08 phr NaOH in PVB UV dosimeter on PP when irradiated with UVI 5 solar simulated light over time. The colour of the film gradually increases from colourless at 0 minutes (0 MED) to a vivid green at 66 minutes (2 MED)

In contrast, most acid-releasing agent-based UV dosimeters do not exhibit a delay, i.e. they are prompt UV dosimeters, such as the MG/CH/NaOH/PP dosimeter. The typical spectral changes and associated photographs observed for a MG/CH/NaOH/PP dosimeter are shown in FIGS. 5 and 6.

It follows that by combining a delayed and prompt UV dosimeter, a "traffic light" system can be created. This combination may be effected by either coating one dosimeter ink (say the delayed one) onto top of the other (the prompt ink) to create a laminate dried ink structure or, preferably, to coat one side of the supporting substrate with delayed ink and the other with the prompt ink, to form a sandwich structure. This is shown schematically in FIG. 7.

Figure 7:
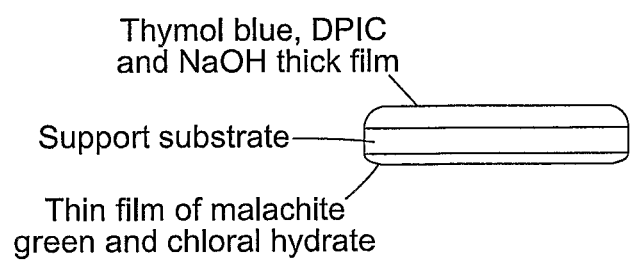
FIG. 7 shows a schematic diagram of a "sandwich" thick film thymol blue and acid-release agent and thin film malachite green and chloral hydrate UV dosimeter.
Figure 8:
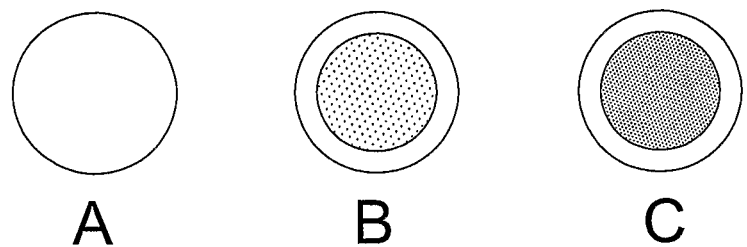
FIG. 8 shows photographs of a "sandwich" thick film thymol blue, chloral hydrate and 0.03 phr NaOH in PVB and thin film malachite green and chloral hydrate in PVB UV dosimeter before (A), after 4 minutes (B) and after 12 minutes (C) irradiation with 4 mW cm$^{-2}$ UVB light. (A) is the initial yellow displayed by the films, (B) is the same films with a pink coloured spot in the centre, (C) is again the same films but the central spot is now blue.

Forming a device as represented in FIG. 7 upon irradiation with solar simulated UV light the following colour sequence change can be observed—yellow/orange (a), green (b) and purple (c), as shown in FIG. 8.

In this traffic light type dosimeter the prompt MG dosimeter turns green (b in FIG. 8) but eventually the delayed TB dosimeter changes colour, turning red/pink and so causing the overall colour of the film to turn blue/purple.

Figure 9:
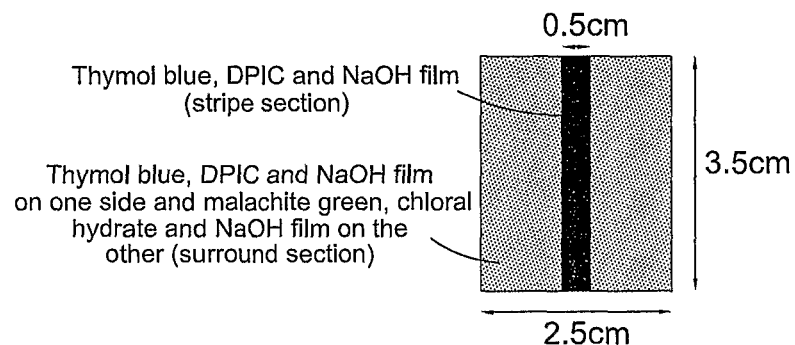
FIG. 9 shows a diagram of a "sandwich" 4-layer thick film thymol blue, DPIC and NaOH in PVB and thin film malachite green, chloral hydrate and NaOH in PVB UV dosimeter on PP with a stripe of the malachite green film removed.

By casting a film with an MG free section it is possible to create a 'flag' type UV dosimeter as represented in FIG. 9.

In this case, a typical yellow TB/DPIC/PVB film was coated on one side of a ~2.5×3.5 cm rectangle of polypropylene (PP). A typical colourless MG/CH/PVB film was then coated on the other side, with the exception of a 5 mm strip in the middle which was covered with a piece of Sellotape. After the ink film was allowed to dry the latter strip was removed.

Figure 10:
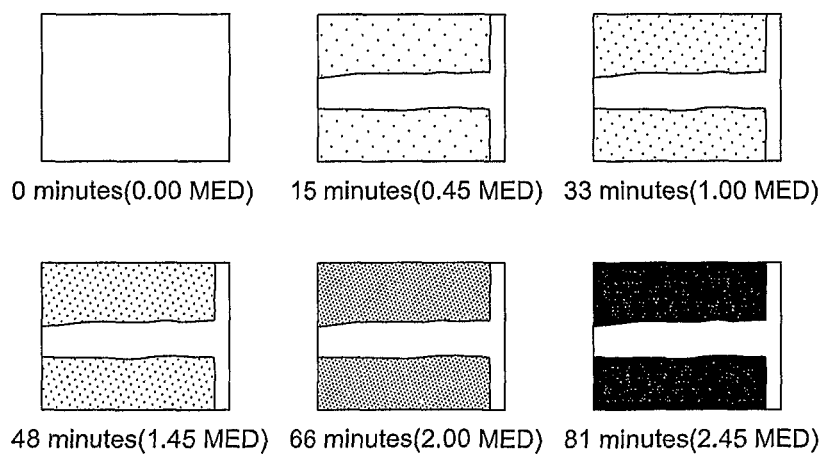
FIG. 10 shows photographs of the dosimeter described in FIG. 8 when irradiated with UVI 5 solar simulated UV light over time; the MED values (med=minimum erythermal dose) are those for skin type II. At 0 minutes the film is completely yellow. After 15 minutes the upper and lower bands of the film are a distinct green colour—due to colour formation by the prompt MG UV dosimeter-, while the central band remains unchanged. 33 minutes later some pink colouration has begun to appear in the central band—due to colour formation by the delayed TB UV dosimeter—and, over the remaining time period (up to 81 minutes), this pink colour develops fully while the upper and lower bands turn deep blue.

The change in colours of an indicator of the type shown in FIG. 9 is shown in the photographs of FIG. 10.

The final film (illustrated in FIG. 10) was initially yellow, but upon irradiation with UVI 5 solar simulated light the MG/CH/PVB film coated areas rapidly develop a green colouration, only at an MED=0.5 does the TB/DPIC/PVB covered only film show signs of turning pink/red. At an MED=1, the pink colour is well developed and by MED=2.0 the red colour is sufficiently developed that the MG/CH/PVB coated areas have turned blue due to the combination of the green and red colourations of the two different dosimeter films. All the MED doses refer to skin type II and at MED=2, the badge wearer will have been significantly over-exposed and likely to exhibit erythema 4-8 h after.

The notable feature of this type of dosimeter is the combination of a prompt and delayed response UV dosimeter to create a flag-type response colourimetric UV dosimeter, with different colours appearing at different stages of the erythermal process. The responsivities of these component films can be times increased or decreased by altering the film composition, e.g. by using different HAs, pH dyes and different concentrations therein. UV blocks can also be used to slow the response of one or both films. As a consequence this type of indicator can be tuned to be effective for most if not all the different skin types. The components of the different inks are inexpensive and the inks themselves printable on many different surfaces including paper and plastics. As a consequence this type of indicator may prove a useful device for reducing the number on incidences of sunburn and, by implication, skin cancer.

In view of the above, it will be appreciated that it is possible to provide an indicator which comprises more than one delayed responsiveness material, each of said material being modified so as to be delayed to differing degrees. In this manner, a device may be provided which is designed to alert a user to differing doses of received UVR. For example, through use of a number of differently "tuned" delayed response UVR sensitive materials, a user could be altered through display of said altered characteristics, when a dose of MED 0.5, 1, 1.5, 2.0 etc. has been received. Dots of ink with the differently modified UVR sensitive material may be provided which sequentially change colour, so as to alert the user as to increased UV exposure and hence potential danger from too much exposure.

The invention claimed is:

1. An ultraviolet radiation (UVR) response indicator which comprises a first UVB and/or UVA radiation sensitive material which has been modified so as to display an altered characteristic in a delayed manner in response to UVB and/or UVA radiation exposure and which comprises a solvent-soluble ion-pair,
   wherein the first UVB and/or UVA radiation sensitive material comprises a UVB and/or UVA radiation-driven acid release agent and a pH indicator which displays altered colour between deprotonated and acid forms,
   wherein the UVB and/or UVA radiation-driven acid release agent includes one or more dyes selected from the group consisting of iodonium salts and sulphonium salts, and
   wherein the first UVB and/or UVA radiation sensitive material further comprises a proton-scavenging agent so as to delay protonation of the pH indicator by the UVB and/or UVA radiation-driven acid release agent, wherein the proton-scavenging agent is a base.

2. The UVR response indicator according to claim 1 wherein the first UVB and/or UVA radiation sensitive material has been modified so as to display its altered characteristic in response to different MED values.

3. The UVR response indicator according to claim 1 wherein the first delayed response UVB and/or UVA radiation sensitive material is used in conjunction with a second or "prompt" response UVB and/or UVA radiation sensitive material.

4. An ultraviolet radiation (UVR) responsive indicator device for use in indicating exposure to UVB and/or UVA radiation over a period of time, the UVR indicator comprising:
  a) a first UVB and/or UVA radiation sensitive material which has been modified so as to display an altered characteristic in a delayed manner on exposure to UVR radiation and which comprises a solvent-soluble ion-pair; and
  b) a second UVB and/or UVA radiation sensitive material which is capable of displaying an altered characteristic promptly on exposure to UVB and/or UVA radiation,
wherein the first UVB and/or UVA radiation sensitive material comprises a UVB and/or UVA radiation-driven acid release agent and a pH indicator which displays altered colour between deprotonated and acid forms, wherein the UVB and/or UVA radiation-driven acid release agent includes one or more dyes selected from the group consisting of iodonium salts and sulphonium salts,
and wherein the first UVB and/or UVA radiation sensitive material further comprises a proton-scavenging agent so as to delay protonation of the pH indicator by the UVB and/or UVA radiation-driven acid release agent, wherein the proton-scavenging agent is a base.

5. The UVR indicator according to claim 4 wherein both prompt and delayed UVB and/or UVA radiation sensitive materials have their response characteristics altered/tempered through the use of a UV filtering agent.

6. The UVR indicator according to claim 4 wherein the first and second UVB and/or UVA radiation sensitive material displays an altered characteristic upon UVB and/or UVA radiation exposure, which is substantially irreversible.

7. The UVR indicator according to claim 4 wherein the first and second UVB and/or UVA radiation sensitive materials are discernable from one another.

8. The UVR indicator according to claim 7 wherein the altered characteristic is a change in colour.

9. The UVR indicator according to claim 4 wherein the proton scavenging agents is NaOH, $Na_2CO_3$, $NaHCO_3$, $NH_4OH$, $Ca(OH)_2$ or any other common base.

10. An ultraviolet radiation (UVR) responsive indicator device for use in indicating exposure to UVB and/or UVA radiation over a period of time, the indicator device comprising:
  a) a first UVB and/or UVA radiation sensitive material which has been modified so as to display an altered characteristic, in a delayed manner on exposure to UVB and/or UVA radiation and which comprises a solvent-soluble ion-pair, wherein the first UVB and/or UVA radiation sensitive material comprises a UVB and/or UVA radiation-driven acid release agent and a pH indicator which displays altered colour between deprotonated and acid forms, wherein the UVB and/or UVA radiation-driven acid release agent includes one or more dyes selected from the group consisting of iodonium salts and sulphonium salts, and wherein the first UVB and/or UVA radiation sensitive material further comprises a proton-scavenging agent so as to delay protonation of the pH indicator by the UVB and/or UVA radiation-driven acid release agent, wherein the proton-scavenging agent is a base; and
  b) a second UVB and/or UVA radiation sensitive material which is capable of displaying an altered characteristic promptly on exposure to UVB and/or UVA radiation,
    wherein the first ("delayed") and second ("prompt") UVR sensitive materials are provided in the form of ink which may be coated onto a substrate.

11. The UVR indicator according to claim 10 wherein the altered characteristics of said first and second UVB and/or UVA radiation sensitive materials combine to provide a visual indication of degree of UVB and/or UVA dose over time.

12. The UVR indicator according to claim 11 wherein the second prompt UVB and/or UVA radiation sensitive material may change colour in response to a first initial dose/level of UVB and/or UVA radiation and the first delayed UVB and/or UVA radiation sensitive material may change colour in response to an increased dose of UVB and/or UVA radiation.

13. The UVR indicator according to claim 12 wherein changes in colour can be visualised separately by way of discrete areas of said first and second UVB and/or UVA radiation sensitive material.

14. The UVR indicator according to claim 12 wherein when the first and second UVB and/or UVA radiation sensitive materials are printed on top of one another, the colour changes are varied progressively.

15. The UVR indicator according to claim 12 wherein the substrate is coloured so as to match/correspond to an initial colour or altered colour of the ink and in this way the ink can be printed in a particular manner so as to reveal or obscure an image in response to UVB and/or UVA radiation.

16. The UVR indicator according to claim 1 in the form of a disposable device formed to be worn by an individual as UVB and/or UVA radiation dosimeter to show when too much exposure to sunlight occurs.

17. The UVR indicator according to claim 16 in the form of a wristband or transfer to be applied to the skin.

18. The UVR indicator according to claim 1 comprising a composition sensitive to both UVA and UVB (200-400 nm) and another only sensitive to UVB.

19. The UVR indicator according to claim 1 comprising control areas displaying said first, second or combined altered permanently coloured areas, whose colour characteristics correspond to that of the UVB and/or UVA radiation sensitive material when a particular amount of UVB and/or UVA radiation has been absorbed.

20. The UVR indicator according to claim 1 wherein the indicator is initially, prior to use, protected from UV light by a removable UV impermeable barrier.

21. The UVR indicator according to claim 2, wherein the MED values are selected from the list consisting of 0.5, 1.0, 1.5, 2.0 and 2.5.

22. The UVR indicator according to claim 4, wherein the iodonium and/or sulphonium salt comprises one or more salts selected from the group consisting of diphenyl iodonium chloride (DPIC), DPI-hexafluorophosphate, DPI-perfluor-1-butanesulfonate, DPI-triflate, 4-iodophenyl-diphenyl sulfonium triflate (IDST), 4-methylthiophenyl-DST, 2-napthyl-DST, 4-chlorophenyl-DST, and 4-bromophenyl-DST.

23. The UVR indicator according to claim 4, wherein the pH indicator comprises one or more pH indicators selected from the group consisting of thymol blue ($TB^-$), Malachite Green (MG), Bromocresol Green (BG), Indophenol Blue (IB), Waxoline Blue (WB), hydroxyethyl amino-azobenzene, methyl red (MR), phenol red (PhR), and any other di/triphenyl methane, aminoazo, aminoanthraquinone dye.

24. The UVR indicator according to claim 1, wherein the indicator comprises a polymeric binder which encapsulates the first UVA and/or UVB radiation sensitive material.

25. The UVR indicator according to claim 1, wherein the indicator is provided in the form of an ink.

26. The UVR indicator according to claim 25, wherein the first UVA and/or UVB radiation sensitive material is dissolved in a polymer solution in a solvent.

27. The UVR indicator according to claim 26, wherein the polymer is PVB and the solvent is 1-butanol.

28. The UVR indicator according to claim 4, wherein the indicator comprises a polymeric binder which encapsulates the first UVA and/or UVB radiation sensitive material.

29. The UVR indicator according to claim 4, wherein the indicator is provided in the form of an ink.

30. The UVR indicator according to claim 29, wherein the first UVA and/or UVB radiation sensitive material is dissolved in a polymer solution in a solvent.

31. The UVR indicator according to claim 30, wherein the polymer is PVB and the solvent is 1-butanol.

32. The UVR indicator according to claim 10, wherein the indicator comprises a polymeric binder which encapsulates the first UVA and/or UVB radiation sensitive material.

33. The UVR indicator according to claim 10, wherein the indicator is provided in the form of an ink.

34. The UVR indicator according to claim 33, wherein the first UVA and/or UVB radiation sensitive material is dissolved in a polymer solution in a solvent.

35. The UVR indicator according to claim 34, wherein the polymer is PVB and the solvent is 1-butanol.

36. An ultraviolet radiation (UVR) response indicator which comprises a first UVB and/or UVA radiation sensitive material which has been modified so as to display an altered characteristic in a delayed manner in response to UVB and/or UVA radiation exposure and which comprises a solvent-soluble ion-pair,
   wherein the first UVB and/or UVA radiation sensitive material consists of
      a UVB and/or UVA radiation-driven acid release agent wherein the UVB and/or UVA radiation-driven acid release agent includes one or more dyes selected from the group consisting of iodonium salts and sulphonium salts;
      a pH indicator which displays altered colour between deprotonated and acid forms; and
      a proton-scavenging agent so as to delay protonation of the pH indicator by the UVB and/or UVA radiation-driven acid release agent, wherein the proton-scavenging agent is a base.

37. The UVR indicator according to claim 1, wherein the iodonium and/or sulphonium salt comprises one or more salts selected from the group consisting of diphenyl iodonium chloride (DPIC), DPI-hexafluorophosphate, DPI-perfluor-1-butanesulfonate, DPI-triflate, 4-iodophenyl-diphenyl sulfonium triflate (IDST), 4-methylthiophenyl-DST, 2-napthyl-DST, 4-chlorophenyl-DST, and 4-bromophenyl-DST.

38. The UVR indicator according to claim 1, wherein the pH indicator comprises one or more pH indicators selected from the group consisting of thymol blue (TB⁻), Malachite Green (MG), Bromocresol Green (BG), Indophenol Blue (IB), Waxoline Blue (WB), hydroxyethyl amino-azobenzene, methyl red (MR), phenol red (PhR), and any other di/triphenyl methane, aminoazo, aminoanthraquinone dye.

39. The UVR indicator according to claim 10, wherein the iodonium and/or sulphonium salt comprises one or more salts selected from the group consisting of diphenyl iodonium chloride (DPIC), DPI-hexafluorophosphate, DPI-perfluor-1-butanesulfonate, DPI-triflate, 4-iodophenyl-diphenyl sulfonium triflate (IDST), 4-methylthiophenyl-DST, 2-napthyl-DST, 4-chlorophenyl-DST, and 4-bromophenyl-DST.

40. The UVR indicator according to claim 10, wherein the pH indicator comprises one or more pH indicators selected from the group consisting of thymol blue (TB⁻), Malachite Green (MG), Bromocresol Green (BG), Indophenol Blue (IB), Waxoline Blue (WB), hydroxyethyl amino-azobenzene, methyl red (MR), phenol red (PhR), and any other di/triphenyl methane, aminoazo, aminoanthraquinone dye.

\* \* \* \* \*